United States Patent
Liang et al.

(10) Patent No.: US 10,071,605 B1
(45) Date of Patent: Sep. 11, 2018

(54) SPECIFIC MULTI-BAND ANTENNA IMPEDANCE MATCHING CIRCUIT AND TIRE-PRESSURE MONITORING DEVICE USING SAME

(71) Applicant: KEYCORE TECHNOLOGY CORP., Zhubei, Hsinchu County (TW)

(72) Inventors: Yang-Te Liang, Zhubei (TW); Po-Wei Chiu, Zhubei (TW); Sheng-Ruei Hsu, Zhubei (TW); Wei-Cheng Lin, Zhubei (TW); Chien-Jen Hsiao, Zhubei (TW); Shih-Hsiu Tseng, Zhubei (TW)

(73) Assignee: KEYCORE TECHNOLOGY CORP., Zhubei (TW)

( * ) Notice: Subject to any disclaimer, the term of this patent is extended or adjusted under 35 U.S.C. 154(b) by 0 days.

(21) Appl. No.: 15/654,713

(22) Filed: Jul. 20, 2017

(51) Int. Cl.
*B60C 23/04* (2006.01)
*H03H 7/38* (2006.01)
*H01Q 21/30* (2006.01)
*H04B 1/18* (2006.01)

(52) U.S. Cl.
CPC ...... *B60C 23/0462* (2013.01); *B60C 23/0444* (2013.01); *H01Q 21/30* (2013.01); *H03H 7/38* (2013.01); *H04B 1/18* (2013.01); *H03H 2007/386* (2013.01)

(58) Field of Classification Search
CPC ............ H03H 7/38; H03H 7/383; H03H 7/40; H03H 2007/386
See application file for complete search history.

(56) References Cited

U.S. PATENT DOCUMENTS

| | | | | |
|---|---|---|---|---|
| 2003/0092388 A1* | 5/2003 | Aggarwal | ................ | H03H 7/38 455/62 |
| 2004/0075614 A1* | 4/2004 | Dakeya | .................. | H01Q 21/30 343/745 |
| 2005/0085200 A1* | 4/2005 | Toncich | ............. | G01R 27/2694 455/121 |
| 2007/0139138 A1* | 6/2007 | Chen | ........................ | H03H 7/46 333/175 |
| 2013/0009841 A1* | 1/2013 | Schmidhammer | ....... | H03F 1/565 343/853 |
| 2014/0225672 A1* | 8/2014 | Wilson | ..................... | H03H 7/38 330/277 |
| 2015/0155846 A1* | 6/2015 | He | ......................... | H01Q 5/335 343/852 |
| 2015/0357989 A1* | 12/2015 | Ma | .......................... | H03H 7/38 455/572 |

(Continued)

*Primary Examiner* — Laura Nguyen
(74) *Attorney, Agent, or Firm* — Jackson IPG PLLC; Demian K. Jackson

(57) ABSTRACT

A specific multi-band antenna impedance matching circuit and a tire-pressure monitoring device using same are disclosed. The antenna impedance matching circuit includes at least one first, one second and one third inductance unit and at least one first, one second and one third capacitance unit. The first capacitance unit is connected at a first end to first ends of the first and the second inductance unit and at a second end to a ground; the second inductance unit and the second capacitance unit are connected in series; the third inductance unit and the third capacitance unit are connected in parallel; and the third inductance unit is connected at a first end to a first end of the second capacitance unit and at a second end to the ground.

20 Claims, 5 Drawing Sheets

(56) References Cited

U.S. PATENT DOCUMENTS

| | | | |
|---|---|---|---|
| 2016/0036126 A1* | 2/2016 | Hung | H01Q 5/335 |
| | | | 343/861 |
| 2017/0054212 A1* | 2/2017 | Liu | H01Q 5/50 |
| 2018/0069524 A1* | 3/2018 | Ishizuka | H03H 7/20 |
| 2018/0138871 A1* | 5/2018 | Li | H03F 1/565 |
| 2018/0159220 A1* | 6/2018 | Kuroda | H03H 7/38 |

* cited by examiner

SPECIFIC MULTI-BAND ANTENNA IMPEDANCE MATCHING CIRCUIT AND TIRE-PRESSURE MONITORING DEVICE USING SAME

FIELD OF THE INVENTION

The present invention relates to an impedance matching circuit and more particularly, to a specific multi-band antenna impedance matching circuit that can save users a lot of cost. The present invention also relates to a tire-pressure monitoring device that uses the specific multi-band antenna impedance matching circuit.

BACKGROUND OF THE INVENTION

Due to the constantly improved communication technology, various kinds of wireless communication devices, such as cell phones, have become an indispensable part in people's daily life. Moreover, since people in the modern society often travel for business or fun in different countries, it becomes very important the wireless communication devices is able to receive and transmit multi-band wireless electrical signals.

However, the wireless communication standards vary from area to area in the world. Currently, most of the available wireless communication device designs include a multi-band antenna or include multiple antennas of different frequency bands to receive and transmit wireless electrical signals of different frequency bands. However, there are difficulties in developing the multi-band antennas.

FIG. 1 is a block diagram of a tunable antenna device 1 which includes a switching circuit 15 to switch the connection of multiple antenna elements 13 to a first tunable matching circuit 11 or a second tunable matching circuit 12, in order to provide different frequency bands for receiving or transmitting multi-band wireless electrical signals.

According to the prior art tunable antenna device 1, multiple antenna elements 13 and multiple tunable matching circuits 11, 12 are required, and a switching circuit 15 is needed to switch the connection of the antenna elements 13 to one of the tunable matching circuits 11, 12 to achieve the multi-band tuning function. However, the multiple antenna elements 13, the multiple tunable matching circuits, i.e. the first and the second tunable matching circuit 11, 12, and the switching circuit 15 inevitably cause the problem of largely increased manufacturing cost.

SUMMARY OF THE INVENTION

To effectively solve the problem in the prior art multi-band antennas, it is a primary object of the present invention to provide a specific multi-band antenna impedance matching circuit that can save users a lot of cost.

Another object of the present invention is to provide a specific multi-band antenna impedance matching circuit that can receive or transmit specific multi-band wireless signals without the need of including any conventional switching circuit.

A further object of the present invention is to provide a tire-pressure monitoring device that can save users a lot of cost.

A still further object of the present invention is to provide a tire-pressure monitoring device that uses a specific multi-band antenna impedance matching circuit to receive or transmit specific multi-band wireless signals without the need of using any conventional switching circuit.

To achieve the above and other objects, the specific multi-band antenna impedance matching circuit according to the present invention includes at least one first inductance unit, at least one first capacitance unit, at least one second inductance unit, at least one second capacitance unit, at least one third inductance unit, and at least one third capacitance unit. The first capacitance unit is connected at a first end to a first end of the first inductance unit and at a second end to a ground. The second inductance unit is connected at a first end to the first end of the first capacitance unit, and the second capacitance unit is connected to the second inductance unit in series. The third inductance unit is connected at a first end to a first end of the second capacitance unit and at a second end to the ground; and the third capacitance unit is connected to the third inductance unit in parallel. The antenna impedance matching circuit of the present invention can receive or transmit specific multi-band wireless signals without the need of using any conventional switching circuit to thereby save users a lot of cost.

According to an embodiment of the present invention, the second inductance unit is connected at a second end to a second end of the second capacitance unit, and the third capacitance unit is connected at a first end to the first end of the third inductance unit and at a second end to the ground.

According to an embodiment of the present invention, the first inductance unit is connected at a second end to a multi-band antenna to form a wireless receiver or a wireless transmitter.

According to an embodiment of the present invention, the specific multi-band antenna impedance matching circuit further includes at least one impedance device, which is connected at a first end to the first end of the third capacitance unit and at a second end to the processor.

According to an embodiment of the present invention, the first, the second and the third inductance unit are respectively an inductor; and the first, the second and the third capacitance unit are respectively a capacitor.

According to an embodiment of the present invention, the first inductance unit has an inductance value between 0.5 nanohenrys (nH) and 10 nH; the second inductance unit has an inductance value between 10 nH and 60 nH; the third inductance unit has an inductance value between 1 nH and 20 nH.

According to an embodiment of the present invention, the first capacitance unit has a capacitance value between 5 picofarads (pF) and 40 pF; the second capacitance unit has a capacitance value between 5 pF and 40 pF; and the third capacitance unit has a capacitance value between 1 pF and 40 pF.

According to an embodiment of the present invention, the antenna impedance matching circuit has two frequencies of 315 MHz and 433 MHz.

According to an embodiment of the present invention, the antenna impedance matching circuit is applied to a tire-pressure monitoring system.

According to an embodiment of the present invention, the first and the second inductance unit include a plurality of first inductors connected in series and a plurality of second inductors connected in series, respectively; and the first and the second capacitance unit include a plurality of first capacitors connected in series and a plurality of second capacitors connected in series, respectively. The first one of the serially connected first inductors is connected at a first end to a first end of the first one of the serially connected first capacitors and a first end of the first one of the serially connected second inductors; the last one of the serially connected first capacitors is connected at a second end to a ground; and the second inductors and the second capacitors are connected in series.

According to an embodiment of the present invention, the third inductance unit includes a plurality of third inductors connected in series and the third capacitance unit includes a plurality of third capacitors connected in series; and the third inductors and the third capacitors are connected in parallel. The first one of the serially connected third inductors and the first one of the serially connected third capacitors are respectively connected at a first end to a first end of the first one of the serially connected second capacitors; and the last one of the serially connected third inductors and the last one of the serially connected third capacitors are respectively connected at a first end to the ground.

To achieve the above and other objects, the tire-pressure monitoring device provided according to the present invention includes a processor, at least one sensor, a battery and a wireless transmitter. The battery is connected to the processor, the sensor and the wireless transmitter to supply required electrical power thereto, and the processor is connected to the sensor and the wireless transmitter. The wireless transmitter includes a multi-band antenna and an antenna impedance matching circuit connected to the multi-band antenna. The antenna impedance matching circuit can be any of the above described antenna impedance matching circuits. The processor and the antenna impedance matching circuit are connected to each other without any switching circuit provided between them. The tire-pressure monitoring device of the present invention can receive or transmit specific multi-band wireless signals without the need of using any conventional switching circuit to thereby save users a lot of cost.

According to an embodiment of the present invention, the sensor is a pressure sensor.

According to another embodiment of the present invention, the sensor includes a pressure sensor and a temperature sensor.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
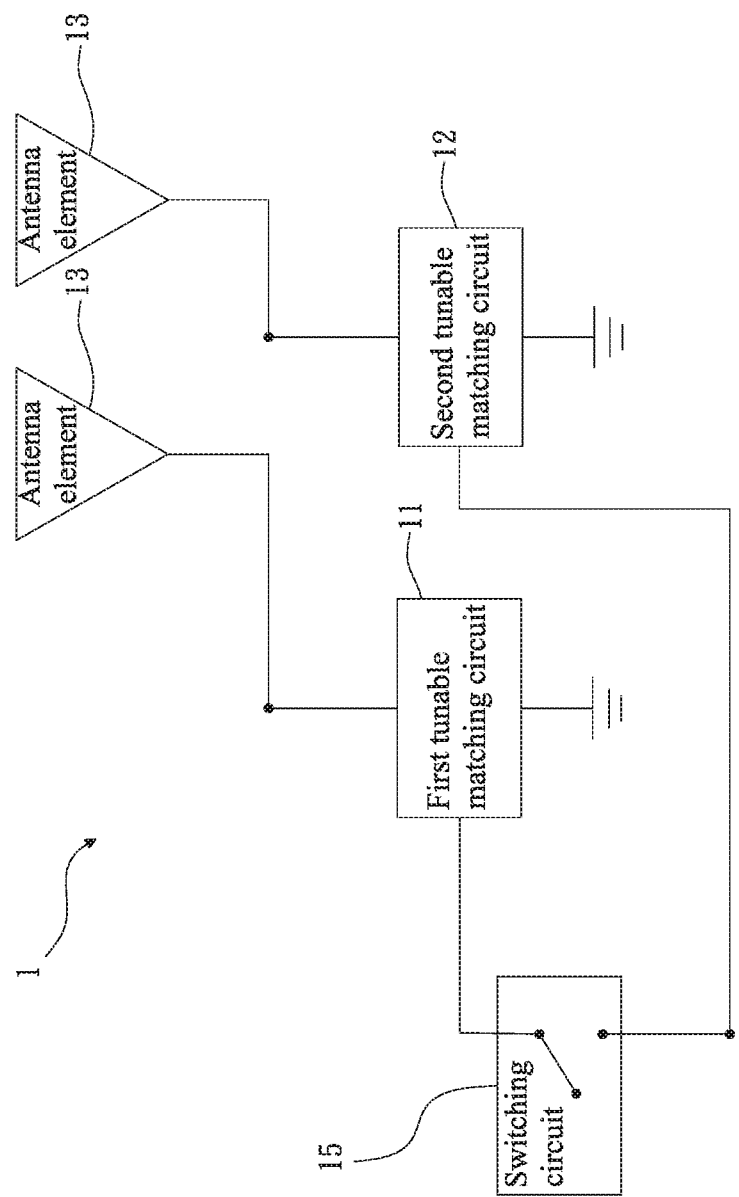
FIG. 1 is a block diagram of a conventional multi-band antenna.

The present invention will now be described with some preferred embodiments thereof and by referring to the accompanying drawings. For the purpose of easy to understand, elements that are the same in the preferred embodiments are denoted by the same reference numerals.

Figure 2:
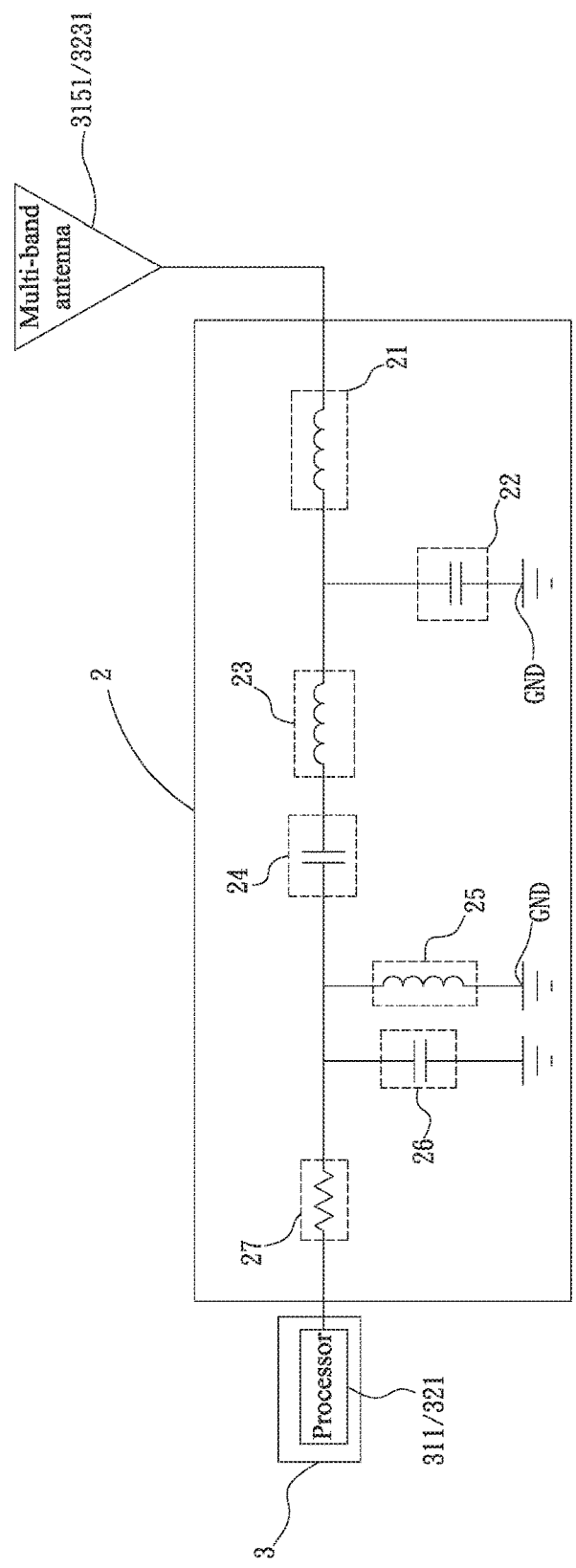
FIG. 2 is a block diagram of a specific multi-band antenna impedance matching circuit according to a first embodiment of the present invention.

FIG. 2 is a block diagram of a specific multi-band antenna impedance matching circuit 2 according to a first embodiment of the present invention. For the purpose of conciseness and clarity, the specific multi-band antenna impedance matching circuit 2 according to the present invention is also briefly referred to as the antenna impedance matching circuit 2 herein. Please refer to FIG. 2 along with FIG. 5. The antenna impedance matching circuit 2 is applied to a tire-pressure monitoring system 3 and includes at least one first inductance unit 21, at least one first capacitance unit 22, at least one second inductance unit 23, at least one second capacitance unit 24, at least one third inductance unit 25, and at least one third capacitance unit 26. In the illustrated first embodiment, the first, second and third inductance units 21, 23 25 are respectively an inductor, and the first, second and third capacitance units 22, 24, 26 are respectively a capacitor. The first inductance unit 21 is electrically connected at a first end to a first end of the first capacitance unit 22 and at a second end to a multi-band antenna 3151 or 3231 to form a wireless transmitter 315 or a wireless receiver 323, respectively, such as the wireless transmitter 315 and the wireless receiver 323 of the tire-pressure monitoring system 3 shown in FIG. 5; and the first capacitance unit 22 is electrically connected at a second end to a ground GND. The first inductance unit 21 and the first capacitance unit 22 together form a low-pass filter, which passes only signals with a frequency lower than a specific frequency, rejects signals with frequency higher than the specific frequency and filters or suppresses interference signals. For example, the low-pass filter formed by the first inductance unit 21 and the first capacitance unit 22 can filter signals with frequency higher than 433 MHz.

In the illustrated first embodiment, the multi-band antennas 3151, 3231 allow frequency selection between 315 MHz and 433 MHz. However, it is understood the above frequency selection range is only illustrative. In practical implementation of the present invention, the multi-band antennas 3151, 3231 may also allow frequency selection between 280 MHz and 600 MHz or other frequency selection ranges. Herein, by "multi-band", it means the antenna impedance matching circuit 2 in the illustrated first embodiment can be used to select and tune more than two bands within the bandwidths of the multi-band antennas 3151, 3232. In the illustrated first embodiment, the antenna impedance matching circuit 2 has specific frequencies of 315 MHz and 433 MHz. However, it is understood the above specific frequencies are only illustrative. In practical implementation of the present invention, other specific multi-band frequencies, such as 488 MHz and 868 MHz or 315 MHz and 488 MHz, may also be selected for the antenna impedance matching circuit 2.

The second inductance unit 23 is electrically connected at a first end to the first ends of the first capacitance unit 22 and the first inductance unit 21, and at a second end to a second end of the second capacitance unit 24, so that the second inductance unit 23 and the second capacitance unit 24 are connected in series. The second capacitance unit 24 is electrically connected at a first end to a first end of the third inductance unit 25. The serially connected second inductance unit 23 and second capacitance unit 24 together form a band-pass filter, which passes only signals within a specific band and rejects signals outside that band. The third inductance unit 25 is also electrically connected at the first end to a first end of the third capacitance unit 26. The third inductance unit 25 and the third capacitance unit 26 are respectively connected at a second end to the ground GND, so that the third inductance unit 25 and the third capacitance unit 26 are connected in parallel. The parallelly connected third inductance unit 25 and third capacitance unit 26 together form a band-pass filter, which passes only signals within a specific band and rejects signals outside that band.

Figure 4:
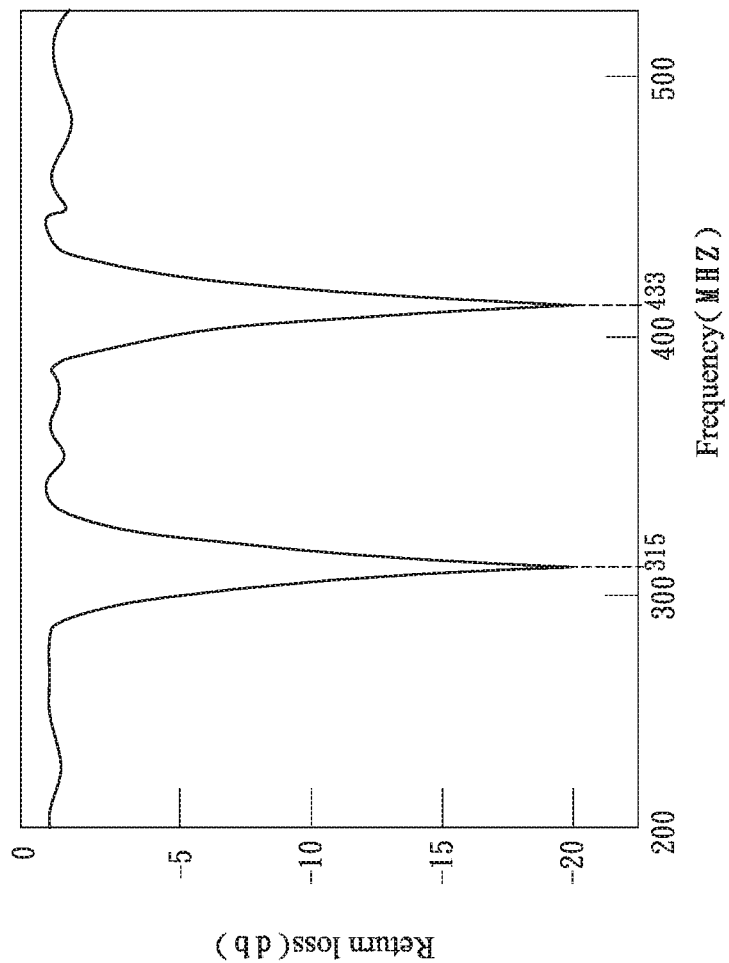
FIG. 4 is a return loss vs. frequency graph of a wireless transmitter or a wireless receiver formed of a multi-band antenna and the specific multi-band antenna impedance matching circuit according to the first embodiment of the present invention.

In the illustrated first embodiment, the first inductance unit 21 has an inductance value between 0.5 nanohenrys (nH) and 10 nH; the second inductance unit 23 has an inductance value between 10 nH and 60 nH; the third inductance unit 25 has an inductance value between 1 nH and 20 nH; the first capacitance unit 22 has a capacitance value between 5 picofarads (pF) and 40 pF; the second capacitance unit 24 has a capacitance value between 5 pF and 40 pF; and the third capacitance unit 26 has a capacitance value between 1 pF and 40 pF. With the above available inductance values of the first, second and third inductance units 21, 23, 25 and the above available capacitance values of the first, second and third capacitance units 22, 24, 26, the antenna impedance matching circuit 2 of the present invention can have stable specific dual-frequency of 315 MHz and 433 MHz and can reject and filter other noises. FIG. 4 is a return loss vs. frequency graph of the wireless transmitter 315 or the wireless receiver 323 formed of the antenna impedance matching circuit 2 and the multi-band antenna 3151 or 3231. In the graph, the y-axis shows the return loss (also referred to as S11) in db (decibels) and the x-axis shows the frequency in MHz. Since the antenna impedance matching circuit 2 of the present invention is applied to a tire-pressure monitoring system 3, the frequency shown in FIG. 4 is the frequency used by the tire-pressure monitoring system 3.

In practical implementation of the present invention, the ranges of the inductance values and the capacitance values as well as the two specific frequencies are not necessarily limited to those used in the first embodiment. In other words, the antenna impedance matching circuit 2 of the present invention can also be adjusted to or select other different inductance values and capacitance values, so as to have other different specific multi-band frequencies, such as 315 MHz and 488 MHz.

As can be seen in FIG. 2, the antenna impedance matching circuit 2 further includes at least one impedance device 27, which can be a resistor. The impedance device 27 is connected at a first end to the first end of the third capacitance unit 26 and at a second end to a processor 311, 321 of the tire-pressure monitoring system 3. The processor 311, 321 can be, for example, a micro control unit (MCU). In the illustrated first embodiment, the impedance device 27 has a resistance value between 0.01 ohm and 10 ohm.

Figure 3:
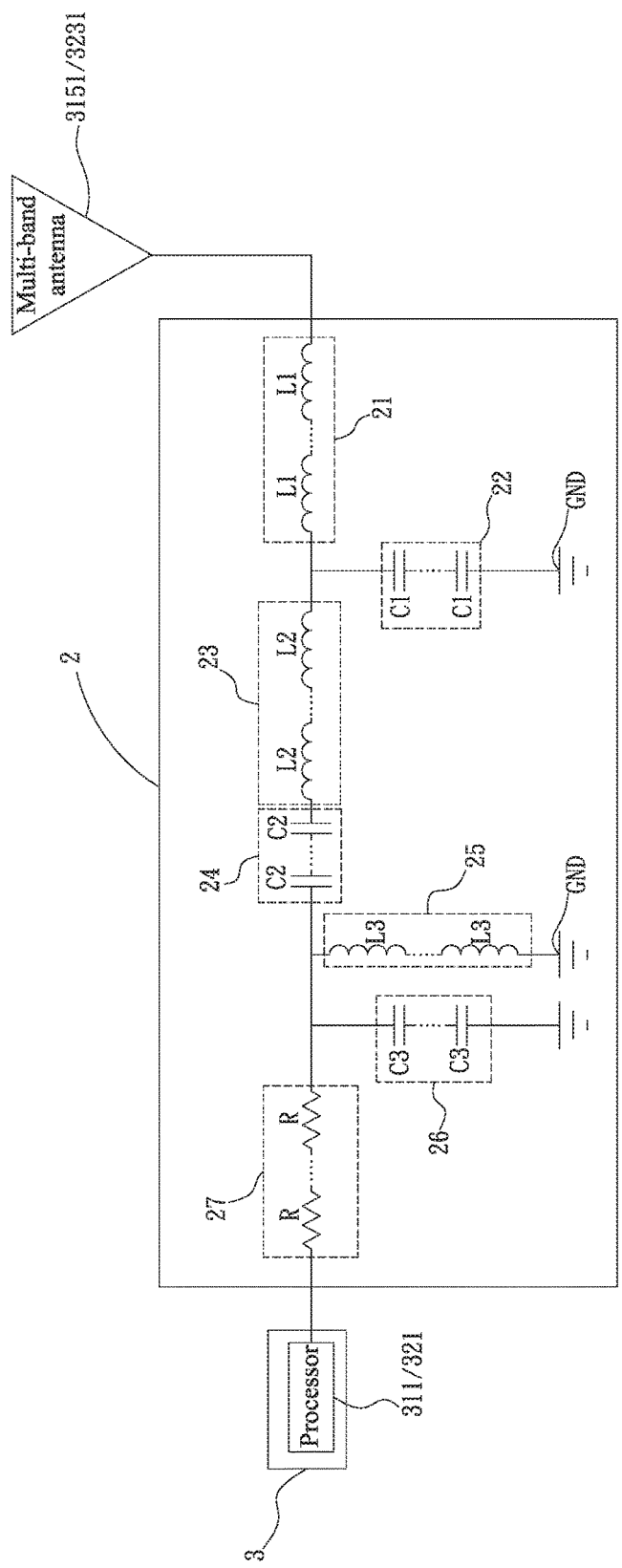
FIG. 3 is a block diagram of an alternative embodiment of the specific multi-band antenna impedance matching circuit according to the present invention.

FIG. 3 is a block diagram of an alternative embodiment of the specific multi-band antenna impedance matching circuit 2 according to the present invention. As shown, in the alternative embodiment, the first and the second inductance unit 21, 23 respectively include a plurality of first inductors L1 connected in series and a plurality of second inductors L2 connected in series, and the first and the second capacitance unit 22, 24 respectively include a plurality of first capacitors C1 connected in series and a plurality of second capacitors C2 connected in series. The first one of the serially connected first inductors L1 is connected at a first end to a first end of the first one of the serially connected first capacitors C1 and to a first end of the first one of the serially connected second inductors L2. The last one of the serially connected first inductors L1 is connected at a first end to the multi-band antenna 3151 or 3231 to form a wireless transmitter 315 or a wireless receiver 323, respectively, such as the wireless transmitter 315 or the wireless receiver 323 of the tire-pressure monitoring system 3 shown in FIG. 5. The last one of the serially connected first capacitors C1 is connected at a second end to a ground GND. The last one of the serially connected second inductors L2 is connected at a second end to a second end of the first one of the serially connected second capacitors C2, so that the second inductors L2 and the second capacitors C2 are connected in series. The third inductance unit 25 includes a plurality of third inductors L3 connected in series and the third capacitance unit 26 includes a plurality of third capacitors C3 connected in series. The first one of the serially connected third inductors L3 and the first one of the serially connected third capacitors C3 are respectively connected at a first end to a first end of the first one of the serially connected second capacitors C2, and the last one of the serially connected third inductors L3 and the last one of the serially connected third capacitors C3 are respectively connected at a first end to the ground GND, such that the third inductors L3 and the third capacitors C3 are connected in parallel. In the alternative embodiment, the impedance device 27 includes a plurality of resistors R connected in series. The first one of the serially connected resistors R is connected at a first end to the first end of the first one of the serially connected third capacitors C3, and the last one of the serially connected resistors R is connected at a first end to the processor or MCU 311, 321 of the tire-pressure monitoring system 3. Further, the first inductors L1 have a total inductance value between 0.5 nH and 10 nH, the second inductors L2 have a total inductance value between 10 nH and 60 nH, the third inductors L3 have a total inductance value between 1 nH and 20 nH, the first capacitors C1 have a total capacitance value between 5 pF and 40 pF, the second capacitors C2 have a total capacitance value between 5 pF and 40 pF, and the third capacitors C3 have a total capacitance value between 1 pF and 40 pF.

With the above design, the antenna impedance matching circuit 2 of the present invention can be manufactured with reduced cost and can transmit or receive specific multi-band wireless signals, such as radio-frequency (RF) wireless signals, without any conventional switching circuit.

Figure 5:
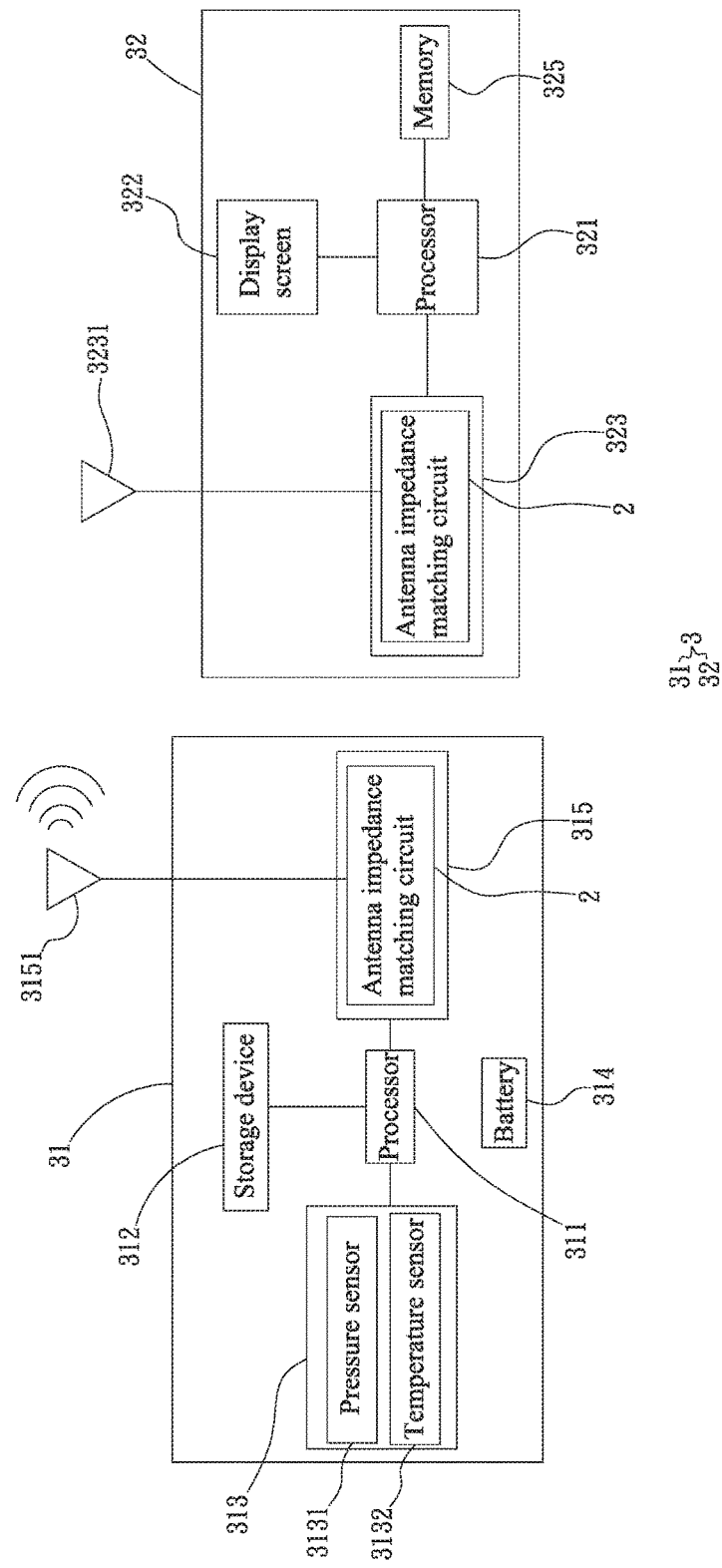
FIG. 5 is a block diagram of a tire-pressure monitoring system according to a second embodiment of the present invention.

FIG. 5 is a block diagram of a tire-pressure monitoring system 3 according to a second embodiment of the present invention. Please refer to FIG. 5 along with FIG. 2. The tire-pressure monitoring system 3 in the second embodiment of the present invention is featured by including the antenna impedance matching circuit 2 according to the first embodiment of the present invention in a tire-pressure monitoring device 31 of the tire-pressure monitoring system 3. The tire-pressure monitoring device 31 is mounted inside or outside a tire of a vehicle, such as a car, and is wirelessly connected to a central control unit's display 32, which is also briefly referred to as a CCU display 32 herein, so that the tire-pressure monitoring device 31 and the CCU display 32 together form the tire-pressure monitoring system (TPMS) 3. The CCU display 32 is mounted on a dashboard in a car for viewing by a user. The tire-pressure monitoring device 31 includes a processor 311, at least one sensor 313, a battery 314, a storage device 312, and a wireless transmitter 315. The battery 314 is electrically connected to the processor 311, the at least one sensor 313 and the wireless transmitter 315 to supply required electrical power thereto. The at least one sensor 313 includes a pressure sensor 3131 for detecting internal pressure of the tire and a temperature sensor 3132 for detecting internal temperature of the tire. The pressure sensor 3131 and the temperature sensor 3132 are separately connected to the processor 311. In an operable embodiment, the temperature sensor 3132 can be omitted and the pressure sensor 3131 is directly connected to the processor 311. In another operable embodiment, the at least one sensor 313 further includes an acceleration sensor, such as a multi-axis acceleration sensor (not shown). In this case, the processor 311 is connected to all of the acceleration sensor, the pressure sensor 3131 and the temperature sensor 3132.

The wireless transmitter 315 includes a multi-band antenna 3151 and an antenna impedance matching circuit 2. In this second embodiment, the antenna impedance matching circuit 2 included in the wireless transmitter 315 is structurally and functionally similar to the antenna impedance matching circuit 2 according to the first embodiment of the present invention and is therefore not repeatedly described herein. The antenna impedance matching circuit 2 is electrically connected to the processor 311 and the multi-band antenna 3151. In the illustrated second embodiment, the processor 311 is a microprocessor or micro control unit (MCU) connected to the sensor 313 and the wireless transmitter 315. The processor 311 processes sensing signals sent by the pressure sensor 3131 and the temperature sensor 3132 to generate a tire-pressure signal and a tire-temperature signal, which are sent via the wireless transmitter 315 to the CCU display 32. The storage device 312 can be a random access memory (RAM), a flash RAM, a solid-state drive (SSD) or an electrically erasable programmable read-only memory (EEPROM) for storing data.

It is noted there is not any switching circuit provided between the processor 311 and the antenna impedance matching circuit 2 for switching between different frequencies. That is, the tire-pressure monitoring device 31 is not internally provided with any of the aforesaid switching circuit and accordingly, no switching circuit is connected to between the processor 311 and the antenna impedance matching circuit 2. According to the second embodiment of the present invention, when the processor 311 sends the tire-pressure signal and the tire-temperature signal via the wireless transmitter 315, since the specific frequencies of the antenna impedance matching circuit 2 are, for example, 315 MHz and 433 MHz, only one single multi-band antenna 3151 is sufficient for transmitting tire-pressure signal and tire-temperature signal (i.e. wireless signals) having specific frequencies of, for example, 315 MHz and 433 MHz. That is, the effect of transmitting specific multi-band wireless signals, such as RF wireless signals, can be achieved with only one multi-band transmitter 315 of the present invention.

The CCU display 32 can be connected to an in-car power source or a battery, and includes a processor 321, which can be a microprocessor or micro control unit (MCU), a display screen 322, a memory 325 and a wireless receiver 323. The processor 321 is connected to the display screen 322, the wireless receiver 323 and the memory 325. The tire-pressure signal and the tire-temperature signal transmitted by the wireless transmitter 315 to the CCU display 32 are received and then sent by the wireless receiver 323 to the processor 321, which in turn sends the received tire-pressure signal and tire-temperature signal to the display screen 322, so that information about pressure and temperature inside the tire is shown on the display screen 322 for a user or driver in the car to read, allowing the user or driver to conveniently control the tire conditions in real time to ensure driving safety. In the second embodiment, the memory 235 can be a random access memory (RAM), a flash RAM, a solid-state drive (SSD) or an electrically erasable programmable read-only memory (EEPROM) for storing data.

The wireless receiver 323 includes another multi-band antenna 3231 and another antenna impedance matching circuit 2. The antenna impedance matching circuit 2 included in the wireless receiver 323 is structurally and functionally similar to the antenna impedance matching circuit 2 according to the first embodiment of the present invention and is therefore not repeatedly described herein. The antenna impedance matching circuit 2 in the wireless receiver 323 is electrically connected to the processor 321 and the other multi-band antenna 3231. In practical implementation of the present invention, the antenna impedance matching circuit 2 and the multi-band antenna 3231 in the wireless receiver 323 can be otherwise changed to be a regular single-band antenna impedance matching circuit and a regular single-band antenna, respectively, which can operate at a frequency of 315 MHz or 433 MHz. By applying the specific multi-band antenna impedance matching circuit 2 of the present invention to the wireless transmitter 315 of the tire-pressure monitoring device 31 for transmitting specific multi-band wireless signals to the wireless receiver 323 of the CCU display 32, the tire-pressure monitoring device 31 with the antenna impedance matching circuit 2 can also be applied to different brands of CCU displays 32 operating at a single frequency of, for example, 315 MHz or 433 MHz. In this manner, the present invention not only can be used with different brands of tire-pressure monitoring systems, but also effectively allows users to use the tire-pressure monitoring system in great convenience and at reduced cost.

In conclusion, by applying the antenna impedance matching circuit 2 of the present invention to the design of the tire-pressure monitoring system 3, a lot of cost can be effectively saved.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A specific multi-band antenna impedance matching circuit, comprising:
    at least one first inductance unit;
    at least one first capacitance unit connected at a first end to a first end of the first inductance unit and at a second end to a ground;
    at least one second inductance unit connected at a first end to the first end of the first capacitance unit;
    at least one second capacitance unit connected to the second inductance unit in series;
    at least one third inductance unit connected at a first end to a first end of the second capacitance unit and at a second end to the ground; and
    at least one third capacitance unit connected to the third inductance unit in parallel.

2. The specific multi-band antenna impedance matching circuit as claimed in claim 1, wherein the second inductance unit is connected at a second end to a second end of the second capacitance unit, and the third capacitance unit is connected at a first end to the first end of the third inductance unit and at a second end to the ground.

3. The specific multi-band antenna impedance matching circuit as claimed in claim 1, wherein the first inductance unit is connected at a second end to a multi-band antenna to form a wireless receiver or a wireless transmitter.

4. The specific multi-band antenna impedance matching circuit as claimed in claim 3, further comprising at least one impedance device, which is connected at a first end to the first end of the third capacitance unit and at a second end to a processor.

5. The specific multi-band antenna impedance matching circuit as claimed in claim 1, wherein the first, the second and the third inductance unit are respectively an inductor; and the first, the second and the third capacitance unit are respectively a capacitor.

6. The specific multi-band antenna impedance matching circuit as claimed in claim 1, wherein the first inductance unit has an inductance value between 0.5 nanohenrys (nH) and 10 nH; the second inductance unit has an inductance value between 10 nH and 60 nH; the third inductance unit has an inductance value between 1 nH and 20 nH.

7. The specific multi-band antenna impedance matching circuit as claimed in claim 6, wherein the first capacitance unit has a capacitance value between 5 picofarads (pF) and 40 pF; the second capacitance unit has a capacitance value between 5 pF and 40 pF; and the third capacitance unit has a capacitance value between 1 pF and 40 pF.

8. The specific multi-band antenna impedance matching circuit as claimed in claim 1, wherein the antenna impedance matching circuit has two frequencies of 315 MHz and 433 MHz.

9. The specific multi-band antenna impedance matching circuit as claimed in claim 1, wherein the antenna impedance matching circuit is applied to a tire-pressure monitoring system.

10. The specific multi-band antenna impedance matching circuit as claimed in claim 1, wherein the first and the second inductance unit include a plurality of first inductors connected in series and a plurality of second inductors connected in series, respectively; the first and the second capacitance unit include a plurality of first capacitors connected in series and a plurality of second capacitors connected in series, respectively; the first one of the serially connected first inductors being connected at a first end to a first end of the first one of the serially connected first capacitors and a first end of the first one of the serially connected second inductors; the last one of the serially connected first capacitors being connected at a second end to a ground; and the second inductors and the second capacitors being connected in series.

11. The specific multi-band antenna impedance matching circuit as claimed in claim 10, wherein the third inductance unit includes a plurality of third inductors connected in series and the third capacitance unit includes a plurality of third capacitors connected in series; the third inductors and the third capacitors being connected in parallel; the first one of the serially connected third inductors and the first one of the serially connected third capacitors being respectively connected at a first end to a first end of the first one of the serially connected second capacitors; and the last one of the serially connected third inductors and the last one of the serially connected third capacitors being respectively connected at a first end to the ground.

12. A tire-pressure monitoring device, comprising a processor, at least one sensor, a battery and a wireless transmitter; the battery being connected to the processor, the sensor and the wireless transmitter to supply required electrical power thereto; the processor being connected to the sensor and the wireless transmitter; the wireless transmitter including a multi-band antenna and an antenna impedance matching circuit connected to the multi-band antenna; the processor and the antenna impedance matching circuit being connected to each other without any switching circuit provided between them; the antenna impedance matching circuit including at least one first inductance unit, at least one first capacitance unit, at least one second inductance unit, at least one second capacitance unit, at least one third inductance unit and at least one third capacitance unit; the first capacitance unit being connected at a first end to a first end of the first inductance unit and at a second end to a ground; the second inductance unit being connected at a first end to the first end of the first capacitance unit; the second capacitance unit and the second inductance unit being connected in series; the third inductance unit being connected at a first end to a first end of the second capacitance unit and at a second end to the ground; and the third capacitance unit and the third inductance unit being connected in parallel.

13. The tire-pressure monitoring device as claimed in claim 12, wherein the sensor includes a pressure sensor connected to the processor.

14. The tire-pressure monitoring device as claimed in claim 12, wherein the sensor includes a pressure sensor and a temperature sensor, which are separately connected to the processor.

15. The tire-pressure monitoring device as claimed in claim 12, wherein the second inductance unit is connected at a second end to a second end of the second capacitance unit, and the third capacitance unit is connected at a first end to the first end of the third inductance unit and at a second end to the ground.

16. The tire-pressure monitoring device as claimed in claim 12, wherein the first inductance unit is connected at a second end to the multi-band antenna to form the wireless transmitter.

17. The tire-pressure monitoring device as claimed in claim 12, wherein the antenna impedance matching circuit further includes at least one impedance device, which is connected at a first end to a first end of the third capacitance unit and at a second end to the processor.

18. The tire-pressure monitoring device as claimed in claim 12, wherein the first, the second and the third inductance unit are respectively an inductor; and the first, the second and the third capacitance unit are respectively a capacitor.

19. The tire-pressure monitoring device as claimed in claim 12, wherein the first inductance unit has an inductance value between 0.5 nanohenrys (nH) and 10 nH; the second inductance unit has an inductance value between 10 nH and 60 nH; the third inductance unit has an inductance value between 1 nH and 20 nH.

20. The tire-pressure monitoring device as claimed in claim 12, wherein the first capacitance unit has a capacitance value between 5 picofarads (pF) and 40 pF; the second capacitance unit has a capacitance value between 5 pF and 40 pF; and the third capacitance unit has a capacitance value between 1 pF and 40 pF.

* * * * *